(12) United States Patent
Purkl et al.

(10) Patent No.: US 9,255,328 B2
(45) Date of Patent: Feb. 9, 2016

(54) METAMATERIAL AND METHOD FOR FORMING A METAMATERIAL USING ATOMIC LAYER DEPOSITION

(71) Applicant: Robert Bosch GmbH, Stuttgart (DE)

(72) Inventors: Fabian Purkl, Palo Alto, CA (US); John Provine, Stanford, CA (US); Gary Yama, Mountain View, CA (US); Ando Feyh, Palo Alto, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/200,198

(22) Filed: Mar. 7, 2014

(65) Prior Publication Data

US 2014/0272333 A1 Sep. 18, 2014

Related U.S. Application Data

(60) Provisional application No. 61/792,402, filed on Mar. 15, 2013.

(51) Int. Cl.
 *B32B 3/02* (2006.01)
 *C23C 16/455* (2006.01)
(52) U.S. Cl.
 CPC ... *C23C 16/45529* (2013.01); *Y10T 428/24851* (2015.01)

(58) Field of Classification Search
 CPC ............... Y10T 48/24802; C32C 16/45527; C32C 16/45529; H01L 21/0228
 See application file for complete search history.

(56) References Cited

U.S. PATENT DOCUMENTS

| 8,273,639 B2 * | 9/2012 | Ji et al. ............... 438/478 |
|---|---|---|
| 2009/0273016 A1 | 11/2009 | Majhi et al. |
| 2011/0069377 A1 | 3/2011 | Wu et al. |
| 2011/0162700 A1 | 7/2011 | Kuznicki et al. |

FOREIGN PATENT DOCUMENTS

| WO | 2011162955 A2 | 12/2011 |
|---|---|---|
| WO | 2012038591 A1 | 3/2012 |

OTHER PUBLICATIONS

International Search Report and Written Opinion corresponding to PCT Application No. PCT/US2014/022189, mailed Jun. 25, 2014 (12 pages).

* cited by examiner

*Primary Examiner* — Elizabeth Mulvaney
(74) *Attorney, Agent, or Firm* — Maginot Moore & Beck LLP

(57) ABSTRACT

A metamaterial includes a first continuous layer formed with a first material by atomic layer deposition (ALD), a first non-continuous layer formed with a second material by ALD on first upper surface portions of a first upper surface of the first continuous layer, and a second continuous layer formed with the first material by ALD on second upper surface portions of the first upper surface of the first continuous layer and on a second upper surface of the first non-continuous layer.

14 Claims, 4 Drawing Sheets

METAMATERIAL AND METHOD FOR FORMING A METAMATERIAL USING ATOMIC LAYER DEPOSITION

This application claims the benefit of priority of U.S. provisional application Ser. No. 61/792,402, filed Mar. 15, 2013, the disclosure of which is herein incorporated by reference in its entirety.

This invention was made with government support under contract N66001-10-1-4004 awarded by the Defense Advanced Research Projects Agency. The government has certain rights in the invention.

FIELD

This disclosure relates to metamaterials and in particular to a metamaterial that is formed using an atomic layer deposition technique.

BACKGROUND

Metamaterials are artificial materials that have been engineered to have particular material properties, including material properties that are not found in nature. The typical metamaterial has a periodic structure that is selected to affect sound, electromagnetic radiation, heat transport, and/or electricity in a particular way. An exemplary metamaterial is negative refractive index material, which is a material that exhibits a negative refractive index in response to electromagnetic radiation of a particular frequency.

The structure of some metamaterials is periodic on a nanometer or sub-nanometer scale. Forming these types of metamaterials using known methods is both time consuming and expensive.

Accordingly, there is a continuing need in the art to develop methods and systems for forming periodically structured metamaterials reliably and less expensively.

SUMMARY

According to an exemplary embodiment of the disclosure, a metamaterial includes a first continuous layer formed with a first material by atomic layer deposition (ALD), a first non-continuous layer formed with a second material by ALD on first upper surface portions of a first upper surface of the first continuous layer, and a second continuous layer formed with the first material by ALD on second upper surface portions of the first upper surface of the first continuous layer and on a second upper surface of the first non-continuous layer.

According to another exemplary embodiment of the disclosure, a method of forming a metamaterial includes forming a first continuous layer with a first material by atomic layer deposition (ALD), forming a first non-continuous layer with a second material by ALD on first upper surface portions of a first upper surface of the first continuous layer, and forming a second continuous layer with the first material by ALD on second upper surface portions of the first upper surface of the first continuous layer and on a second upper surface of the first non-continuous layer.

BRIEF DESCRIPTION OF THE FIGURES

The above-described features and advantages, as well as others, should become more readily apparent to those of ordinary skill in the art by reference to the following detailed description and the accompanying figures in which.

DETAILED DESCRIPTION

Figure 1:
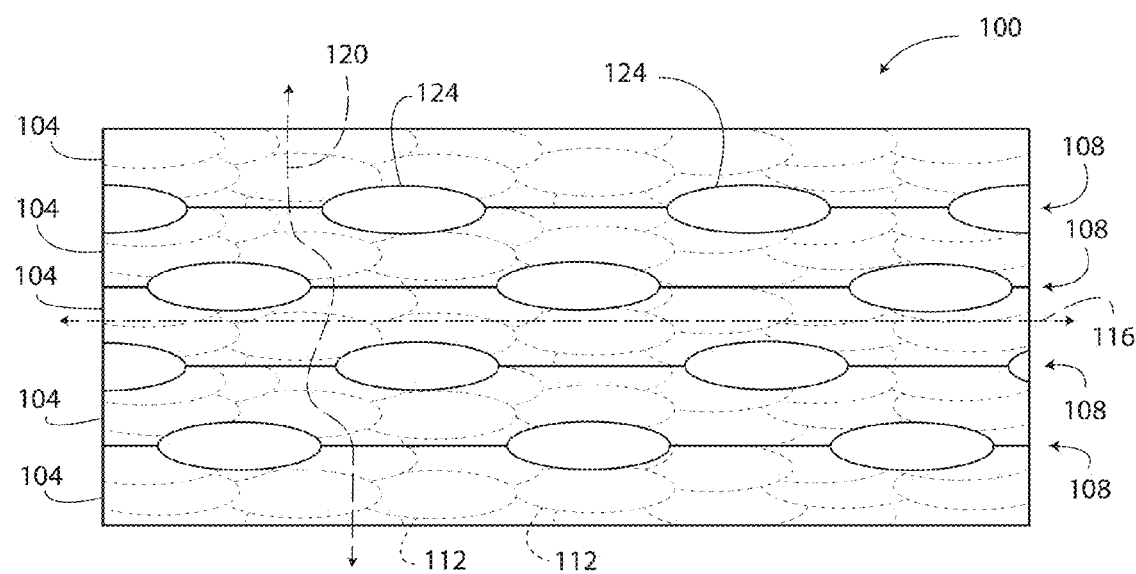
FIG. 1 is a cross sectional block diagram view of a metamaterial including five continuous host material layers and four non-continuous inclusion material layers, as described herein.

For the purpose of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

As shown in FIG. 1 a metamaterial 100 includes host material layers 104 stacked upon inclusion material layers 108. The host material layers 104 are formed from numerous host seeds 112 (shown in broken lines) deposited onto each other to form a continuous layer or film. The host material layers 104 form a continuous material that extends across the width and the height of the metamaterial 100 as shown by the line 116 and the line 120 respectively. The host material layers 104 are formed from any material (referred to as the host material) that is suitable for depositing using atomic layer deposition ("ALD"), as desired by those of ordinary skill in the art. Exemplary host materials include metals such as platinum and tungsten; and oxides such as aluminum oxide ($Al_2O_3$), hafnium oxide ($HfO_2$), and zirconium dioxide ($ZrO_2$).

The inclusion material layers 108 are formed from inclusion seeds 124 (shown in solid lines), which are deposited between the host material layers 104. The inclusion material layers 108 form a non-continuous layer or film. In particular, each inclusion seed 124 is isolated from each other inclusion seed by the material of the host material layers 104. Accordingly, the inclusion seeds 124 are embedded within the host material of the metamaterial 100. The inclusion material layers 104 are formed from any material (referred to as the inclusion material) that is suitable for depositing using ALD, as desired by those of ordinary skill in the art. Exemplary inclusion materials include metals such as platinum and tungsten; and oxides such as aluminum oxide (Al$_2$O$_3$), hafnium oxide (HfO$_2$), and zirconium dioxide (ZrO$_2$). The inclusion material layers 108 are formed from a different material than the host material.

As described above, the metamaterial 100 is formed using ALD. ALD is a type of chemical vapor deposition technique in which two self-limiting chemical reactions are sequentially used to deposit a material onto a substrate that is positioned in a chamber. One benefit of ALD is that the technique enables the thickness of the material deposited onto the substrate to be precisely controlled with sub-nanometer resolution.

In the typical ALD technique, the deposition of a material is divided into a number of cycles. Each of the cycles includes a first half cycle and a second half cycle. During the first half cycle, a first precursor is pumped into the chamber and reacts with the substrate. The reaction of the first precursor with the substrate is self-limiting, since the reaction stops as soon as all (or substantially all) of the exposed surface area of the substrate has reacted with the first precursor. The reaction of the substrate with the first precursor forms a species on the surface of the substrate. Next, any remaining first precursor is removed from the chamber.

During the second half cycle, a second precursor is pumped into the chamber. The second precursor reacts with the species formed on the surface of the substrate to form the desired deposition material. The resultant thickness of the deposition material depends on how many cycles are conducted. The reaction of the second precursor with the species is also self-limiting, since the reaction stops as soon as all (or substantially all) of the species of the substrate has reacted with the second precursor.

Figure 2:
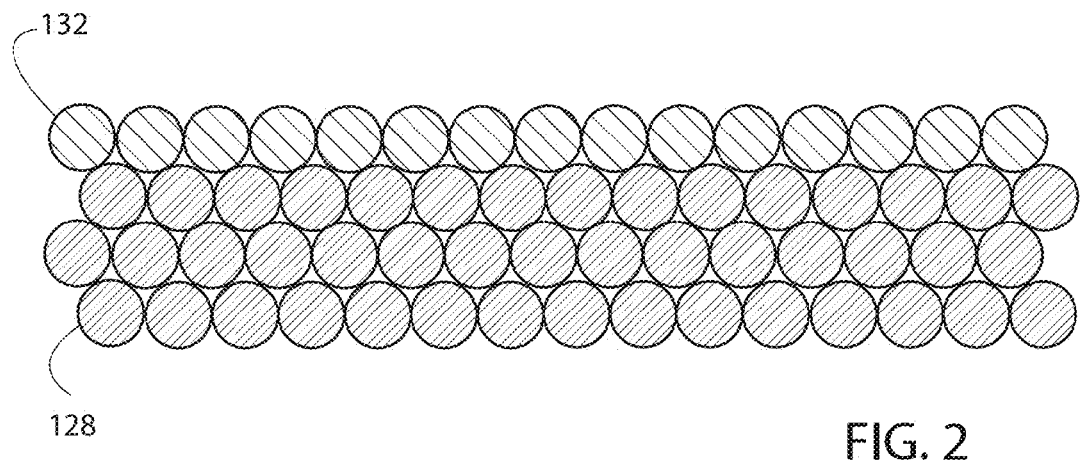
FIG. 2 is a cross sectional block diagram view of a model illustrating the formation of a continuous layer of a deposited material onto a substrate using atomic layer deposition.

With reference to FIG. 2, a typical model view of ALD is depicted. The model view shows atoms of a substrate 128 and atoms of a material 132 deposited onto the substrate. In the typical model depiction of ALD, the deposited material 132 forms a film on the substrate 128 that is a continuous layer of atoms uniformly distributed across the substrate.

Figure 3:
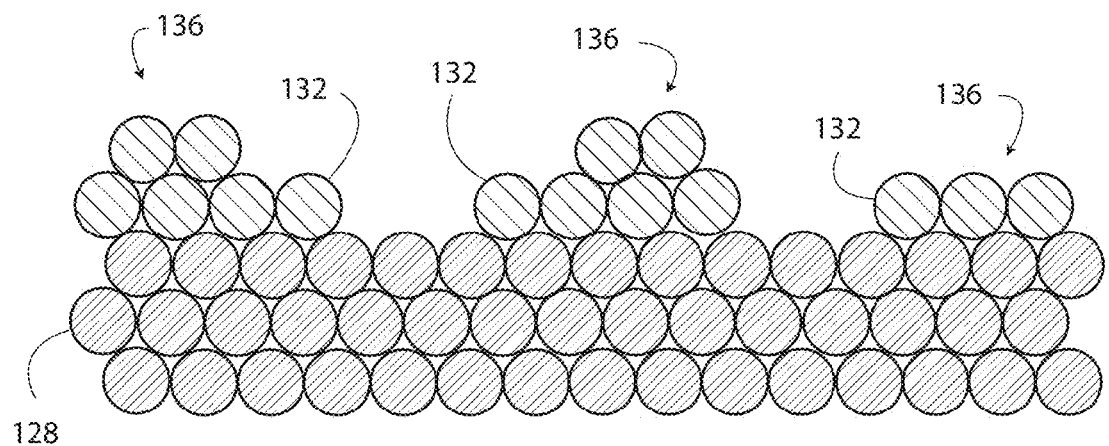
FIG. 3 is a cross sectional block diagram view of another model illustrating the formation of a non-continuous layer of a deposited material onto a substrate using atomic layer deposition.

As shown in FIG. 3, a slightly more realistic model view of ALD is depicted. The model view shows atoms of the substrate 128 and atoms of the material 132 deposited onto the substrate. Instead of forming a uniform film, the deposited material 132 has seeded at three seeding sites 136. The three "islands" of deposited material 132 are isolated from each other and have formed a non-continuous layer or film. The seeding behavior of the deposited material 132 depends on the type of deposited material, the material of the substrate 128, the temperature, and the type of ALD (thermal or plasma enhanced deposition), among other factors. An often seen example of the above-described seeding behavior is that the deposited material 132 is deposited at randomly distributed spots on the substrate 128. As a result of the random distribution, islands of the deposited material 132 form, grow, and coalesce after a certain number of cycles or at a certain average thickness of the material 132. Usually, the average thickness at which a continuous film begins to coalesces is approximately one nanometer.

Figure 4:
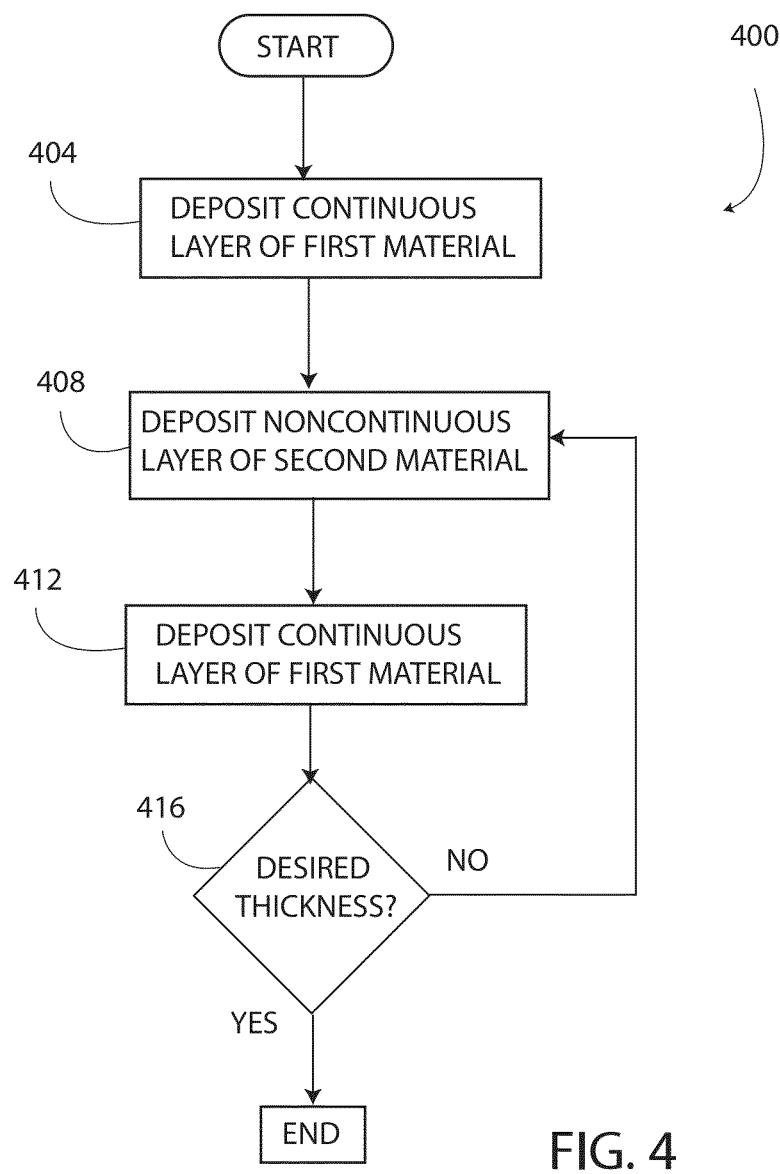
FIG. 4 is flowchart illustrating a method of forming the metamaterial of FIG. 1.
Figure 5:
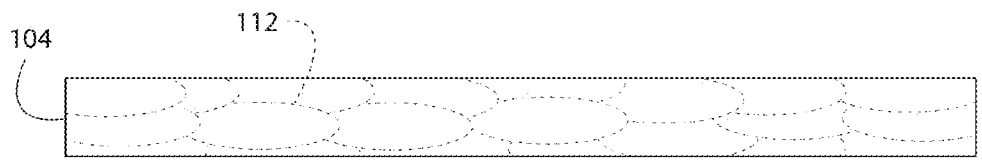
FIG. 5 is a cross sectional block diagram view illustrating a first host material layer of the metamaterial of FIG. 1.

As shown in FIG. 4, the metamaterial 100, in at least one embodiment, is formed according to the method 400. As shown in block 404 and with reference to FIG. 5, first host material layer 104 is formed using ALD. A suitable number of ALD cycles are performed so that the host seeds 112, also referred to herein as "islands," coalesce into a continuous layer/film.

Figure 6:
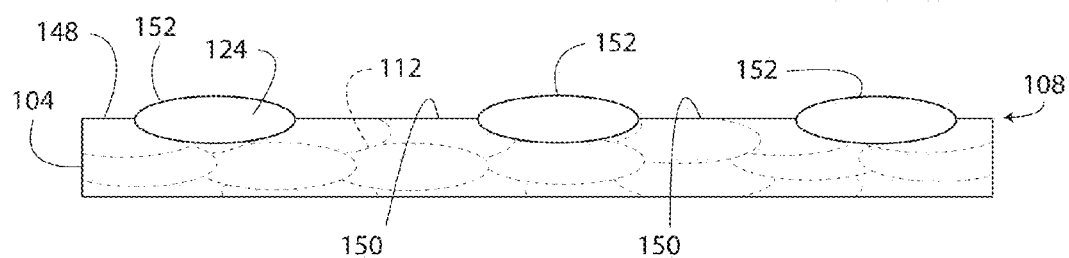
FIG. 6 is a cross sectional block diagram view illustrating the first host material layer and an inclusion material layer formed on first upper surface portions of a first upper surface of the first host material layer.

Next, in block 408 and as shown in FIG. 6, an inclusion material layer 108 is deposited onto the host material layer 104 using ALD. In particular, the inclusion material layer 108 is formed on first upper surface portions 146 of an upper surface 148 of the host material layer 104.

The inclusion material layer 108 includes three inclusion seeds 124 (i.e. seeding sites 136 in FIG. 3), which are isolated from each other, such that the inclusion material is deposited in a non-continuous layer/film. A suitable number of ALD cycles are performed so that the inclusion seeds 124 are desirably sized, but remain isolated from each other in the non-continuous layer. Specifically, the suitable number of ALD cycles results in stopping of the ALD process before the inclusions seeds 124 have coalesced. The sub-nanometer resolution of the ALD process enables the inclusion seeds 124 to be embedded within the host material in a highly controllable ratio.

Figure 7:
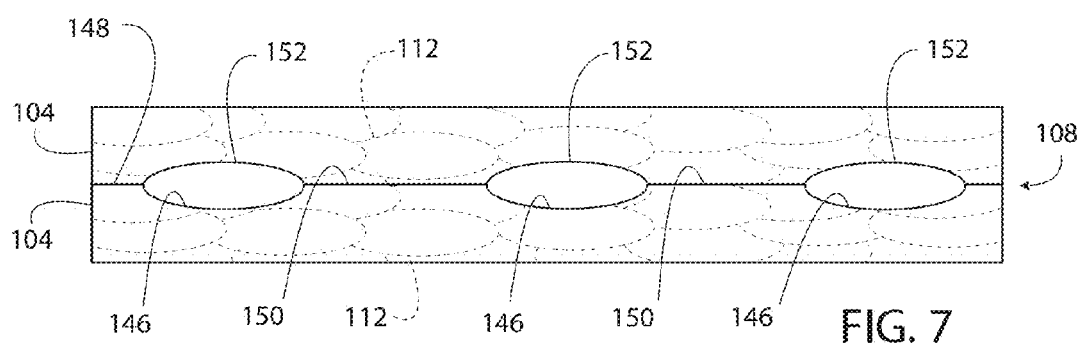
FIG. 7 is a cross sectional block diagram view illustrating the first host material layer, the inclusion material layer, and a second host material layer formed on second upper surface portions of the first upper surface of the first host material and on a second upper surface of the inclusion material layer.

In block 412 and with reference to FIG. 7, another host material layer 104 is deposited onto the first host material layer and the inclusion material layer 108 using ALD. In particular, the host material layer 104 is formed on second upper surface portions 150 of the upper surface 148 and on an upper surface 152 of the inclusion material layer 108. A suitable number of ALD cycles are performed so that the host seeds 112 coalesce into a continuous layer. As shown, the second host material layer 104 contacts the first host material layer 104 and the inclusion material layer 108.

In block 416, if the resultant metamaterial 100 has a total thickness that is suitable, then the method 400 ends and the metamaterial is prepared for use. Also in block 416, if the resultant metamaterial 100 has not reached the desired thickness, then additional host material layers 104 and inclusion material layers 108 are deposited.

Following formation, the metamaterial 100 may be post-treated to further optimize one or more characteristics of the metamaterial. An exemplary post-treatment includes thermal annealing or other forms of densification. Post-treatment may activate dopants, change film-to-film or film-to-wafer substrate interfaces, densify deposited films, change states of grown films, and move dopants within the metamaterial 100, for example.

The metamaterial 100 formed by the method 400 has properties that are different from the properties of the host material and the inclusion material separately. The properties of the metamaterial 100 are even different from laminates and nanolaminates formed with the host material and the inclusion material. Exemplary properties that are controllable by the structure and the materials of a metamaterial 100 include electrical resistivity, temperature coefficient of resistance, thermal conductivity, refractive indices, Young's modulus, yield strength, and others. Accordingly, the metamaterial 100 is customizable to fit a certain application by configuring at least the following variables, including the type of host material, the type of inclusion material, the thickness of the host material layers 104, the thickness of the inclusion material layers 108, the size of the host seeds 112, the size of the inclusion seeds 124, and the total number of the layers 104, 108. In one exemplary embodiment, the metamaterial includes a host material that is a metal and an inclusion material that is a dielectric. The resulting metamaterial 100 is conductive with a higher electrical resistivity than the pure metal.

Figure 8:
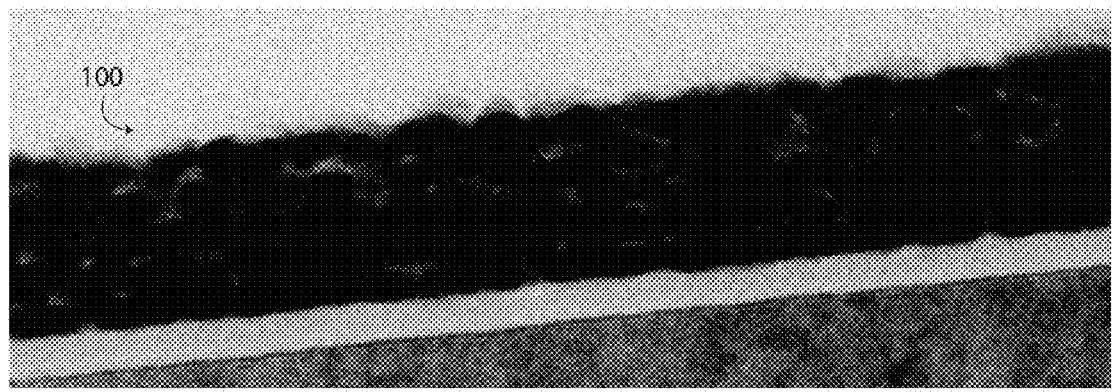
FIG. 8 is a transmission electron microscope image of an exemplary metamaterial formed by alternating layers of platinum and aluminum oxide.

As shown in FIG. 8, an exemplary metamaterial 100 has been formed. The metamaterial includes platinum as the host material and aluminum oxide as the inclusion material.

In another embodiment, a metamaterial is formed with multiple types of host materials and multiple types of inclusion materials in an alloy matrix.

In some embodiments, the inclusion seeds 124 of some inclusion material layers 108 may form a continuous layer.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A metamaterial comprising:
 a first continuous layer formed with a first material by atomic layer deposition (ALD);
 a first non-continuous layer formed with a second material by ALD on first upper surface portions of a first upper surface of the first continuous layer; and
 a second continuous layer formed with the first material by ALD on second upper surface portions of the first upper surface of the first continuous layer and on a second upper surface of the first non-continuous layer.

2. The metamaterial of claim 1, wherein:
 the first material is a metal; and
 the second material is a dielectric.

3. The metamaterial of claim 1, further comprising:
 a second non-continuous layer formed with the second material by ALD on third upper surface portions of a third upper surface of the second continuous layer.

4. The metamaterial of claim 3, further comprising:
 a third continuous layer formed with the first material by ALD on fourth upper surface portions of the third upper surface of the second continuous layer and on a fourth upper surface of the second non-continuous layer.

5. The metamaterial of claim 4, wherein:
 the first material is a metal; and
 the second material is a dielectric.

6. A method of forming a metamaterial comprising:
 forming a first continuous layer with a first material by atomic layer deposition (ALD);
 forming a first non-continuous layer with a second material by ALD on first upper surface portions of a first upper surface of the first continuous layer; and
 forming a second continuous layer with the first material by ALD on second upper surface portions of the first upper surface of the first continuous layer and on a second upper surface of the first non-continuous layer.

7. The method of forming a metamaterial of claim 6, wherein:
 the first material is a metal; and
 the second material is a dielectric.

8. The method of forming a metamaterial of claim 6, further comprising:
 forming second non-continuous layer with the second material by ALD on third upper surface portions of a third upper surface of the second continuous layer.

9. The method of forming a metamaterial of claim 8, further comprising:
 forming a third continuous layer with the first material by ALD on fourth upper surface portions of the third upper surface of the second continuous layer and on a fourth upper surface of the second non-continuous layer.

10. The method of forming a metamaterial of claim 9, wherein:
 the first material is a metal; and
 the second material is a dielectric.

11. The method of forming a metamaterial of claim 6, wherein:
 the forming the first continuous layer includes performing a first number of cycles of ALD;
 the forming the first non-continuous layer includes performing a second number of cycles of ALD; and
 the first number of cycles is greater than the second number of cycles.

12. The method of forming a metamaterial of claim 6, wherein the forming the first continuous layer includes performing cycles of ALD at least until islands of the first material have coalesced.

13. The method of forming a metamaterial of claim 6, wherein the forming the first non-continuous layer includes:
 performing cycles of ALD to form first islands of the second material; and
 stopping the performing cycles of ALD before the first islands have coalesced.

14. The method of forming a metamaterial of claim 13, wherein the forming the second continuous layer includes performing cycles of ALD at least until second islands of the first material have coalesced.

* * * * *